(12) United States Patent
Koyanagi et al.

(10) Patent No.: US 11,502,664 B2
(45) Date of Patent: Nov. 15, 2022

(54) ELECTRONIC COMPONENT

(71) Applicant: Murata Manufacturing Co., Ltd., Nagaokakyo (JP)

(72) Inventors: Takuya Koyanagi, Nagaokakyo (JP); Hideki Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 350 days.

(21) Appl. No.: 16/892,332

(22) Filed: Jun. 4, 2020

(65) Prior Publication Data
US 2020/0295731 A1   Sep. 17, 2020

Related U.S. Application Data

(63) Continuation of application No. PCT/JP2018/043840, filed on Nov. 28, 2018.

(30) Foreign Application Priority Data

Dec. 13, 2017  (JP) .............................. JP2017-238931

(51) Int. Cl.
*H03H 9/02* (2006.01)
*H03H 9/13* (2006.01)
*H03H 9/145* (2006.01)

(52) U.S. Cl.
CPC .... *H03H 9/02228* (2013.01); *H03H 9/02566* (2013.01); *H03H 9/131* (2013.01); *H03H 9/14541* (2013.01)

(58) Field of Classification Search
CPC .......... H03H 9/02228; H03H 9/02566; H03H 9/131; H03H 9/14541; H03H 9/0552;
(Continued)

(56) References Cited

U.S. PATENT DOCUMENTS

2004/0226162 A1* 11/2004 Miura ...................... H03H 3/08
29/595
2004/0238866 A1* 12/2004 Iwashita ........... H01L 21/31691
257/296

(Continued)

FOREIGN PATENT DOCUMENTS

JP    06-120416 A     4/1994
JP    2004-296679 A  10/2004
(Continued)

OTHER PUBLICATIONS

Official Communication issued in International Patent Application No. PCT/JP2018/043840, dated Feb. 19, 2019.

*Primary Examiner* — Jeffrey M Shin
(74) *Attorney, Agent, or Firm* — Keating & Bennett, LLP

(57) ABSTRACT

An electronic component includes a support member, a piezoelectric film, and an interdigital transducer. The support member includes silicon as a primary component. The piezoelectric film is provided directly or indirectly on the support member. The interdigital transducer includes a plurality of electrode fingers. The plurality of electrode fingers are provided side by side separately from each other. The interdigital transducer is provided on the principal surface of the piezoelectric film. The film thickness of the piezoelectric film is about 3.5 $\lambda$ or less, where $\lambda$ denotes the wavelength of an acoustic wave determined by the electrode finger pitch of the interdigital transducer. In the support member, the high-impurity-concentration region is further from the piezoelectric film than the low-impurity-concentration region.

14 Claims, 2 Drawing Sheets

(58) Field of Classification Search
CPC .............. H03H 9/02574; H03H 9/0557; H01L 25/065; H01L 25/07; H01L 25/18; H03L 41/053; H03L 41/187
See application file for complete search history.

(56) References Cited

U.S. PATENT DOCUMENTS

2013/0009302 A1  1/2013  Tomiyasu et al.
2018/0159497 A1  6/2018  Iwamoto et al.

FOREIGN PATENT DOCUMENTS

| JP | 2005-347295 A | 12/2005 |
| JP | 2005-348026 A | 12/2005 |
| WO | 2011/092781 A1 | 8/2011 |
| WO | 2017/043427 A1 | 3/2017 |

* cited by examiner

ELECTRONIC COMPONENT

CROSS REFERENCE TO RELATED APPLICATIONS

This application claims the benefit of priority to Japanese Patent Application No. 2017-238931 filed on Dec. 13, 2017 and is a Continuation Application of PCT Application No. PCT/JP2018/043840 filed on Nov. 28, 2018. The entire contents of each application are hereby incorporated herein by reference.

BACKGROUND OF THE INVENTION

1. Field of the Invention

The present invention generally relates to an electronic component and, in particular, to an electronic component including a piezoelectric film and an interdigital transducer.

2. Description of the Related Art

To date, acoustic wave devices (acoustic wave elements) including a piezoelectric film and an interdigital transducer have been known (see, for example, International Publication No. 2017/043427).

In an acoustic wave device described in International Publication No. 2017/043427, a low acoustic velocity film, a piezoelectric film, and an interdigital transducer are stacked in this order on a high acoustic velocity support substrate formed of silicon. The acoustic velocity of an acoustic wave that propagates through the high acoustic velocity support substrate is higher than the acoustic velocity of an acoustic wave that propagates through the piezoelectric film. The acoustic velocity of an acoustic wave that propagates through the low acoustic velocity film is lower than the acoustic velocity of an acoustic wave that propagates through the piezoelectric film.

In the case in which the acoustic wave element in the related art described in International Publication No. 2017/043427 is used with a semiconductor element, if the acoustic wave element and the semiconductor element are separate bodies, the overall size increases.

Therefore, it is considered that the silicon support substrate of the acoustic wave element and the silicon substrate of the semiconductor element be merged with each other and integrally formed so as to realize size reduction.

However, regarding the semiconductor element, the resistivity of the silicon substrate is low since a pn junction is formed by an appropriate impurity being added to the silicon substrate (support member) to which an n-type impurity (for example, phosphorus) or a p-type impurity (for example, boron) is added. Using a silicon substrate having low resistivity for an acoustic wave element including a piezoelectric film having a thickness of 3.5 λ or less (λ is the wavelength of an acoustic wave determined by the electrode finger pitch of the interdigital transducer), there is a problem that the current which has to flow to the piezoelectric film leaks to the silicon substrate such that loss increases.

SUMMARY OF THE INVENTION

Preferred embodiments of the present invention provide electronic components in each of which an acoustic wave element and a semiconductor element are integrally provided to achieve size reduction and in each of which an occurrence of leakage current to the support member is able to be significantly reduced or prevented.

An electronic component according to a preferred embodiment of the present invention includes a support member, a piezoelectric film, and an interdigital transducer. The support member includes silicon as a primary component. The piezoelectric film is provided directly or indirectly on the support member. The interdigital transducer includes a plurality of electrode fingers. The plurality of electrode fingers are provided side by side separately from each other. The interdigital transducer is provided on the principal surface of the piezoelectric film. The film thickness of the piezoelectric film in the thickness direction of the support member is about 3.5 λ or less, where λ denotes the wavelength of an acoustic wave determined by the electrode finger pitch of the interdigital transducer. The support member includes a high-impurity-concentration region and a low-impurity-concentration region. The high-impurity-concentration region includes an impurity. The low-impurity-concentration region is a region having a lower impurity concentration than the high-impurity-concentration region. The low-impurity-concentration region, the piezoelectric film, and the interdigital transducer together define an acoustic wave element. The acoustic velocity of a bulk wave that propagates through the low-impurity-concentration region is higher than the acoustic velocity of an acoustic wave that propagates through the piezoelectric film. The high-impurity-concentration region defines the semiconductor element and is farther from the piezoelectric film than the low-impurity-concentration region.

Preferred embodiments of the present invention provide acoustic wave elements and semiconductor elements that are each integrally provided to achieve size reduction, and that each significantly reduce or prevent an occurrence of leakage current to a support member.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Electronic component according to preferred embodiments of the present invention will be described below with reference to the drawings.

Figure 1:
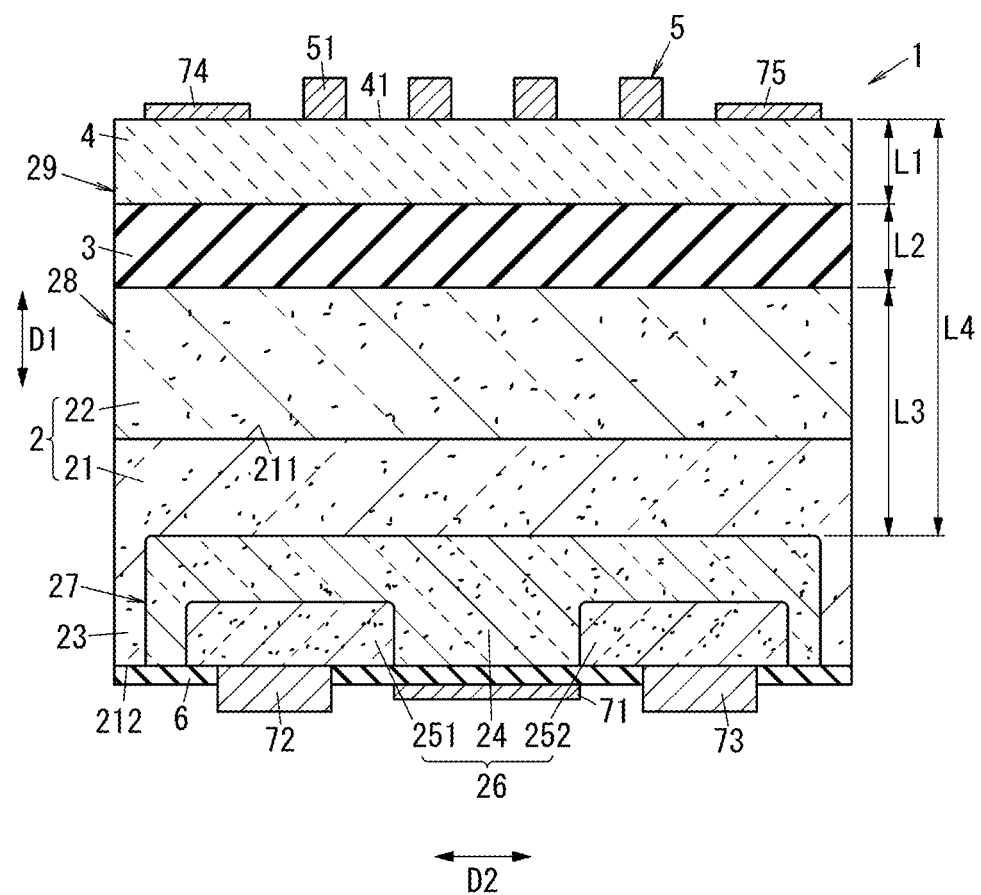
FIG. 1 is a sectional view of an electronic component according to a preferred embodiment of the present invention.
Figure 3:
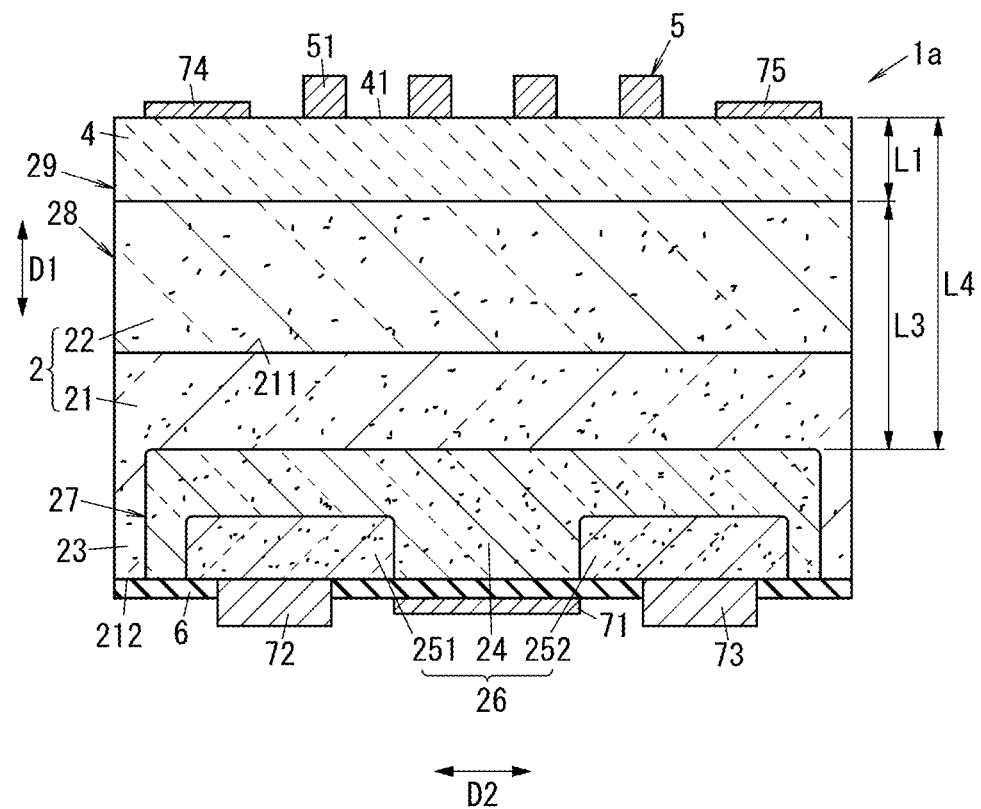
FIG. 3 is a sectional view of an electronic component according to a modified example of a preferred embodiment of the present invention.

FIG. 1 and FIG. 3 described in the preferred embodiments and the like below are schematic drawings, and the size ratio and the thickness ratio of each element in the drawings are not limited to reflecting actual dimensional ratios.

(1) Overall Configuration of Electronic Component

Features of an electronic component according to a preferred embodiment of the present invention will be described with reference to the drawings.

As shown in FIG. 1, the electronic component 1 according to the present preferred embodiment includes a support member 2, a low acoustic velocity film 3, a piezoelectric film 4, and an interdigital transducer 5. In addition, the electronic component 1 includes an insulating film 6 and a plurality of electrodes. The support member 2 is a substrate including silicon as a primary component. The piezoelectric film 4 is provided directly or indirectly on the support member 2. The interdigital transducer 5 is provided on the principal surface of the piezoelectric film 4. The film thickness L1 of the piezoelectric film 4 in the thickness direction of the support member 2 (first direction D1) is preferably, for example, about 3.5 λ or less, where λ denotes the wavelength of an acoustic wave determined by the electrode finger pitch of the interdigital transducer 5.

In the above-described electronic component 1, the support member 2 includes a high-impurity-concentration region 27 and a low-impurity-concentration region 28. The high-impurity-concentration region 27 includes an impurity and defines a semiconductor element. The low-impurity-concentration region 28 is a region having a lower impurity concentration than the high-impurity-concentration region 27. The high-impurity-concentration region 27 is farther from the piezoelectric film 4 than the low-impurity-concentration region 28.

(2) Elements of Electronic Component

Next, each element of the electronic component 1 according to the present preferred embodiment will be described with reference to the drawings.

(2.1) Piezoelectric Film

The piezoelectric film 4 is stacked directly or indirectly on the low acoustic velocity film 3. The material of the piezoelectric film 4 is preferably, for example, $LiTaO_3$, $LiNbO_3$, ZnO, AlN, or PZT.

The film thickness L1 of the piezoelectric film 4 in the thickness direction of the support member 2 (first direction D1) is preferably, for example, about 3.5 λ or less, where λ denotes the wavelength of an acoustic wave determined by the period of the electrode fingers 51 of the interdigital transducer 5. The film thickness L1 of the piezoelectric film 4 being about 3.5 λ or less increases the Q factor. Setting the film thickness L1 of the piezoelectric film 4 to be about 2.5 λ or less, for example, provides significantly improved temperature characteristics. That is, the TCF (temperature coefficient of frequency) indicating the amount of change in frequency in accordance with a temperature change is able to be reduced. Further, setting the film thickness L1 of the piezoelectric film 4 to be about 1.5 λ or less, for example, facilitates adjustment of the acoustic velocity of an acoustic wave.

(2.2) Interdigital Transducer

The interdigital transducer 5 includes a plurality of electrode fingers 51 and two busbars (not shown in the drawings) and are provided on the principal surface 41 of the piezoelectric film 4. The plurality of electrode fingers 51 are provided side by side in the second direction D2. The two busbars not shown in the drawings have an elongated shape, where the longitudinal direction is the second direction, and are electrically coupled to the plurality of electrode fingers 51. More specifically, the plurality of electrode fingers 51 include a plurality of first electrode fingers and a plurality of second electrode fingers. The plurality of first electrode fingers are electrically coupled to a first busbar of the two busbars. The plurality of second electrode fingers 51 are electrically coupled to a second busbar of the two busbars.

The material of the interdigital transducer 5 is an appropriate metal material, for example, Al, Cu, Pt, Au, Ag, Ti, Ni, Cr, Mo, or W or an alloy mainly including any one of these metals. In this regard, the interdigital transducer 5 may have a structure in which a plurality of metal films including these metals or alloys are stacked.

(2.3) Low Acoustic Velocity Film

The low acoustic velocity film 3 is provided between the support member 2 and the piezoelectric film 4. The acoustic velocity of a bulk wave that propagates through the low acoustic velocity film 3 is lower than the acoustic velocity of a bulk wave that propagates through the piezoelectric film 4. Since the low acoustic velocity film 3 is provided between the support member 2 and the piezoelectric film 4, the acoustic velocity of an acoustic wave is reduced. The energy of the acoustic wave concentrates on a low acoustic velocity medium. Therefore, an effect of confining the acoustic wave energy to the piezoelectric film 4 and the interdigital transducer 5 in which the acoustic wave is excited is able to be improved. As a result, loss is able to be reduced and the Q factor is able to be increased compared with the case in which the low acoustic velocity film 3 is not provided.

The material of the low acoustic velocity film 3 is preferably, for example, silicon oxide, glass, silicon oxynitride, tantalum oxide, or a compound in which fluorine, carbon, or boron is added to silicon oxide or a material including any one of the above-described materials as a primary component.

The material of the low acoustic velocity film 3 being silicon oxide provides significantly improved temperature characteristics. The elastic constant of $LiTaO_3$ that is a material of the piezoelectric film 4 has negative temperature characteristics, and the silicon oxide has positive temperature characteristics. Therefore, the absolute value of the TCF (temperature coefficient of frequency) of the electronic component 1 is able to be reduced. Further, the specific acoustic impedance in silicon oxide is less than the specific acoustic impedance in $LiTaO_3$ that is a material of the piezoelectric film 4. Therefore, both increase in electromechanical coupling coefficient, that is, enlargement of the band width ratio, and significant improvement in the temperature coefficient of frequency are able to be provided.

The film thickness L2 of the low acoustic velocity film 3 is preferably about 2.0 λ or less, for example, where λ denotes the wavelength of an acoustic wave determined by the period of the electrode fingers of the interdigital transducer 5. Setting the film thickness L2 of the low acoustic velocity film 3 to be about 2.0 λ or less provides significantly reduced film stress and, as a result, warping of the wafer is able to be significantly reduced or prevented. Accordingly, a significant improvement in the non-defective rate and stabilization of characteristics is able to be provided. When film thickness L2 of the low acoustic velocity film 3 is within the range of about 0.1 λ or more and about 0.5 λ or less, for example, the electromechanical coupling coefficient hardly changes.

(2.4) Insulating Film

The insulating film 6 is provided opposite to the low acoustic velocity film 3 with respect to the support member 2. More specifically, the insulating film 6 is provided on the principal surface 212 of the substrate 21 of the support member 2. The material of the insulating film 6 is preferably, for example, silicon oxide.

(2.5) Electrode

A gate electrode 71 (control electrode), a source electrode 72 (main electrode), and a drain electrode 73 (main electrode) define a plurality of electrodes. The gate electrode 71 is provided opposite to an n-type impurity region 24 with the insulating film 6 provided therebetween and is electrically coupled to an electrode (not shown in the drawings) provided on the principal surface 41 of the piezoelectric film 4 via, for example, a side-surface wiring line or a through wiring line. The source electrode 72 is provided on the p-type impurity region 251 of the substrate 21 and is electrically coupled to an electrode 74 provided on the principal surface 41 of the piezoelectric film 4 via, for example, a side-surface wiring line or a through wiring line. The drain electrode 73 is provided on the p-type impurity region 252 of the substrate 21 and is electrically coupled to an electrode 75 provided on the principal surface 41 of the piezoelectric film 4 via, for example, a side-surface wiring line or a through wiring line.

(2.6) Support Member

The support member 2 includes the substrate 21 defining and functioning as a first member and a low-impurity film 22 defining and functioning as a second member. In this regard, the first member is preferably, for example, a member including silicon as a primary component and including at least a high-impurity-concentration region 27. The second member is preferably, for example, a member including silicon as a primary component and including at least a portion of the low-impurity-concentration region 28.

The substrate 21 is preferably made of, for example, silicon, and a dopant is partially added thereto. More specifically, the substrate 21 includes an undoped semiconductor region 23, the n-type impurity region 24 including an n-type impurity (n-type dopant), and two p-type impurity regions 251 and 252 including a p-type impurity (p-type dopant). The undoped semiconductor region 23 does not include intentional impurities but that may include incidental impurities. The n-type impurity is preferably, for example, phosphorus or arsenic. The p-type impurity is preferably, for example, boron or aluminum.

In this regard, an example of a method to provide the substrate 21 will be described. A silicon substrate having a reduced impurity concentration as a result of being subjected to refining is doped with an n-type impurity by ion implantation to provide the n-type impurity region 24. A portion of the n-type impurity region 24 is doped with a p-type impurity by ion implantation to provide the two p-type impurity regions 251 and 252. At this time, the depth of the n-type impurity region 24 and the depth of the two p-type impurity regions 251 and 252 are controlled by changing the ion implantation acceleration. Accordingly, the high-impurity-concentration region 27 having a pn junction is formed in the silicon substrate. In the substrate 21, the region in which an impurity is not added, that is, the undoped semiconductor region 23, is a portion of the low-impurity-concentration region 28.

The high-impurity-concentration region 27 preferably has an impurity concentration of, for example, about $10^{16}$ [atoms/cm$^3$], and the resistivity of the high-impurity-concentration region 27 is preferably, for example, about $1 \times 10^{-6}$ Ωcm. The low-impurity-concentration region 28 has a lower impurity concentration than the high-impurity-concentration region 27, and the impurity concentration is preferably, for example, about $10^{10}$ [atoms/cm$^3$]. The resistivity of the low-impurity-concentration region 28 is preferably, for example, about 6 kΩcm.

The low-impurity film 22 is provided on the principal surface 211 of the substrate 21. The acoustic velocity of an acoustic wave that propagates through the low-impurity film 22 is higher than the acoustic velocity of an acoustic wave that propagates through the piezoelectric film 4. In the example shown in FIG. 1, the low-impurity film 22 is a silicon film and is a semiconductor film including no dopant. That is, the low-impurity film 22 is an undoped semiconductor film. The low-impurity film 22 and the semiconductor region 23 of the substrate 21 together define the low-impurity-concentration region 28.

In the above-described support member 2, the semiconductor element 26 is provided by combining the n-type impurity region 24 and the p-type impurity regions 251 and 252. More specifically, a metal-oxide-semiconductor field-effect transistor (MOSFET) defining and functioning as the semiconductor element 26 is preferably provided by combining the n-type impurity region 24, the p-type impurity regions 251 and 252, the insulating film 6, the gate electrode 71, the source electrode 72, and the drain electrode 73. Examples of the semiconductor element 26 include a diode and a transistor.

In this regard, the n-type impurity region 24 and the two p-type impurity regions 251 and 252 have higher dopant-including impurity concentrations than the undoped semiconductor region 23 of the substrate 21 and the low-impurity film 22. Therefore, the n-type impurity region 24 and the two p-type impurity regions 251 and 252 define the high-impurity-concentration region 27. On the other hand, the undoped semiconductor region 23 of the substrate 21 and the low-impurity film 22 have relatively low impurity concentrations and, therefore, define the low-impurity-concentration region 28 in the support member 2. As a result, the support member 2 includes the high-impurity-concentration region 27 and the low-impurity-concentration region 28.

As described above, the high-impurity-concentration region 27 defines the semiconductor element 26, and the low-impurity-concentration region 28 of the substrate 21, the low-impurity film 22, the low acoustic velocity film 3, the piezoelectric film 4, and the interdigital transducer 5 together define an acoustic wave element 29.

In the support member 2 described above, the high-impurity-concentration region 27 is farther from the piezoelectric film 4 than the low-impurity-concentration region 28. In other words, in the first direction D1, at least the low-impurity-concentration region 28 exists between the piezoelectric film 4 and the high-impurity-concentration region 27.

In the support member 2 described above, the thickness L3 of the low-impurity-concentration region 28 is preferably about 10 λ or more, for example, where λ denotes the wavelength of an acoustic wave determined by the electrode finger pitch of the interdigital transducer 5. Accordingly, the maximum phase value in a higher-order mode is able to be decreased, and the strength in the higher-order mode is able to be reduced. The thickness L3 of the low-impurity-concentration region 28 is preferably about 180 μm or less, for example. If the low-impurity-concentration region 28 increases in thickness, the heat dissipation effect deteriorates. However, the thickness L3 of the low-impurity-concentration region 28 being about 180 μm or less provides a significant reduction or prevention of the heat dissipation effect being deteriorated. In addition, the thickness L3 of the low-impurity-concentration region 28 being about 180 μm or less provides a significant reduction in profile. In this regard, the thickness L3 of the low-impurity-concentration region 28 is equal or substantially equal to the distance from the boundary surface between the low-impurity film 22 and the low acoustic velocity film 3 to the high-impurity-concentration region 27.

In the thickness direction (first direction D1) of the support member 2 (substrate 21), the distance L4 between the principal surface 41 of the piezoelectric film 4 and the high-impurity-concentration region 27 is preferably about 40 λ or more, for example, where λ denotes the wavelength of an acoustic wave determined by the period of the electrode fingers 51 of the interdigital transducer 5. The distance L4 between the principal surface 41 of the piezoelectric film 4 and the high-impurity-concentration region 27 is the total of the film thickness L1 of the piezoelectric film 4, the film thickness L2 of the low acoustic velocity film 3, and the thickness L3 of the low-impurity-concentration region 28.

Figure 2:
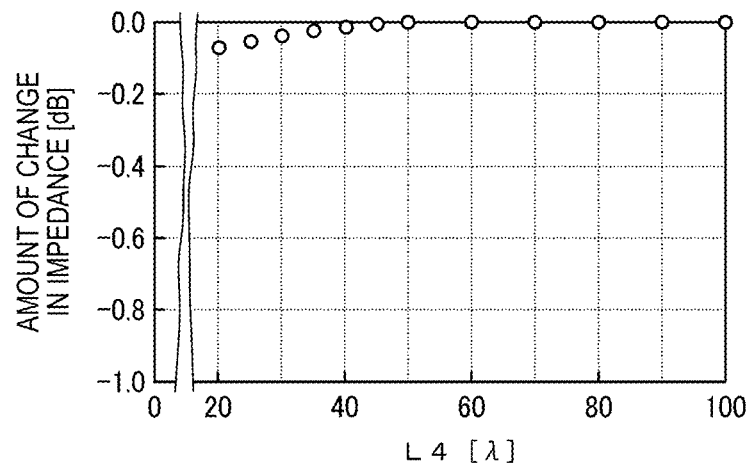
FIG. 2 is a characteristics diagram of the amount of change in impedance in the above-described electronic component.

FIG. 2 shows the amount of change in impedance between the terminals when the acoustic wave element 29 (device including the low-impurity-concentration region 28 of the support member 2, the low acoustic velocity film 3, the piezoelectric film 4, and the interdigital transducer 5) in the electronic component 1 is used as a one-port resonator. The horizontal axis of FIG. 2 represents the distance L4 between the principal surface 41 of the piezoelectric film 4 and the high-impurity-concentration region 27. When the distance L4 is about 40 λ or more, the amount of change in impedance is substantially 0. An example of the condition to provide the characteristics shown in FIG. 2 is as described below. Preferably, for example, the material of the low-impurity-concentration region 28 is silicon, and the material of the low acoustic velocity film 3 is $SiO_2$. Further, preferably, for example, the material of the piezoelectric film 4 is $LiTaO_3$, and the material of the interdigital transducer 5 is Al. The λ determined by the electrode finger pitch of the interdigital transducer 5 is preferably about 1 μm, for example. The duty ratio of the electrode fingers 51 of the interdigital transducer 5 is preferably about 0.5, for example.

In the thickness direction of the support member 2 (first direction D1), the distance L4 between the principal surface 41 of the piezoelectric film 4 and the high-impurity-concentration region 27 is preferably about 40 λ or more, for example, where λ denotes the wavelength of an acoustic wave determined by the period of the electrode fingers 51 of the interdigital transducer 5. Accordingly, in the support member 2, the low-impurity-concentration region 28 exists in the region in which the energy of the acoustic wave hardly exists. As a result, occurrence of leakage current to the support member 2 is able to be significantly reduced or prevented.

(3) Advantageous Effects

As described above, in the electronic component 1 according to the present preferred embodiment, the high-impurity-concentration region 27 of the support member 2 is farther from the piezoelectric film 4 than the low-impurity-concentration region 28. Accordingly, the high-impurity-concentration region 27 of the support member 2 defines the semiconductor element 26, and the low-impurity-concentration region 28 of the support member 2 defines the acoustic wave element 29. In the support member 2, since the acoustic-wave-element-29-side impurity concentration is low, a leakage current to the support member 2 does not readily occur. As a result, even when the semiconductor element 26 is provided in the support member 2, an occurrence of leakage current to the support member 2 is able to be significantly reduced or prevented while size reduction is achieved. Further, a composite device of the acoustic wave element 29 and the semiconductor element 26 is able to be provided while significantly reducing or preventing loss of the acoustic wave element 29.

In the electronic component 1 according to the present preferred embodiment, the distance L4 between the principal surface 41 of the piezoelectric film 4 and the high-impurity-concentration region 27 is preferably about 40 λ or more, for example. Accordingly, in the support member 2, the low-impurity-concentration region 28 exists in the region in which the energy of the acoustic wave hardly exists. As a result, a leakage current is able to be further reduced or prevented.

In the electronic component 1 according to the present preferred embodiment, the thickness L3 of the low-impurity-concentration region 28 in the thickness direction of the support member 2 (first direction D1) is preferably about 10 λ or more and about 180 μm or less, for example. Accordingly, the maximum phase value in a higher-order mode is able to be decreased, and the strength in the higher-order mode is able to be reduced. In addition, deterioration of the heat dissipation effect due to the low-impurity-concentration region 28 increasing in thickness is able to be significantly reduced or prevented from occurring, and a reduction in profile is able to be achieved.

In the electronic component 1 according to the present preferred embodiment, the low acoustic velocity film 3 is provided between the support member 2 and the piezoelectric film 4. Accordingly, in the low acoustic velocity film 3, the acoustic velocity of an acoustic wave is reduced, and an effect of confining the acoustic wave energy to the piezoelectric film 4 and the interdigital transducer 5 in which the acoustic wave is excited is able to be improved. As a result, loss is able to be reduced and the Q factor is able to be increased compared with the case in which the low acoustic velocity film 3 is not provided.

In the electronic component 1 according to the present preferred embodiment, the low acoustic velocity film 3 is preferably made of, for example, silicon oxide. Accordingly, the temperature characteristics is able to be significantly improved. The elastic constant of the piezoelectric film 4 has negative temperature characteristics, and the silicon oxide has positive temperature characteristics. Therefore, the absolute value of the TCF of the electronic component 1 is able to be reduced. Further, the specific acoustic impedance in silicon oxide is less than the specific acoustic impedance in the piezoelectric film 4. Therefore, both an increase in electromechanical coupling coefficient, that is, enlargement of the band width ratio, and significant improvement in the temperature coefficient of frequency are able to be provided.

In the electronic component 1 according to the present preferred embodiment, the film thickness of the low acoustic velocity film 3 is preferably about 2.0 λ or less, for example. Accordingly, the film stress is able to be reduced. As a result, warping of the wafer is able to be reduced or prevented, and a significant improvement in the non-defective rate and stabilization of characteristics is able to be achieved.

(4) Modified Example

A modified example of a preferred embodiment of the present invention will be described below.

As shown in FIG. 3, an electronic component 1a as modified example 1 of the present preferred embodiment may not include the low acoustic velocity film 3. The electronic component 1a includes the support member 2, the piezoelectric film 4, and the interdigital transducer 5. The piezoelectric film 4 in the present modified example is provided directly on the support member 2. In the present modified example, the distance L4 between the principal surface 41 of the piezoelectric film 4 and the high-impurity-concentration region 27 is the total of the film thickness L1 of the piezoelectric film 4 and the thickness L3 of the low-impurity-concentration region 28. The n-type impurity region 24 and the p-type impurity regions 251 and 252 define the semiconductor element 26 to provide the high-impurity-concentration region 27. The undoped semiconductor region 23 of the substrate 21 and the low-impurity film 22 define the low-impurity-concentration region 28. In this regard, the support member 2, the piezoelectric film 4, and the interdigital transducer 5 in the modified example have the same or similar functions as the support member 2, the piezoelectric film 4, and the interdigital transducer 5, respectively, in the above-described preferred embodiment.

In the electronic component 1 according to the above-described preferred embodiment and the electronic component 1a according to the modified example, the combination of the first member including at least the high-impurity-concentration region 27 and the second member including at least a portion of the low-impurity-concentration region 28 is not limited to the combination of the substrate 21 and the low-impurity film 22. That is, the combination of the first member and the second member is not limited to the combination of the substrate and the film. The combination of the first member and the second member may be the combination of the substrates. For example, the combination of the first member and the second member may be the combination of a substrate having a high impurity concentration and a substrate having a low impurity concentration. The first member and the second member are not limited to being separated from each other and may be integrated. For example, the high-impurity-concentration region 27 and the low-impurity-concentration region 28 may be provided in one substrate. In short, the support member 2 is not limited to being a substrate or being a film, provided that the support member 2 has the high-impurity-concentration region 27 and the low-impurity-concentration region 28 and that the high-impurity-concentration region 27 is further from the piezoelectric film 4 than the low-impurity-concentration region 28.

In the electronic component 1 according to the above-described preferred embodiment and the electronic component 1a according to the modified example, a close-contact layer, for example, $SiO_2$, may be provided between the substrate 21 and the low-impurity film 22. The thickness L3 of the low-impurity-concentration region 28 in the first direction D1 is equal or substantially equal to the film thickness of the low-impurity film 22.

The electronic component 1a according to each of the modified examples has the same or similar advantageous effects as the electronic component 1 according to the preferred embodiment.

The above-described preferred embodiment and modified example are some of the various preferred embodiments and modified examples according to the present invention. The preferred embodiment and the modified example may be variously changed in accordance with design and the like.

According to the preferred embodiment and the modified example described above, the following features are provided.

An electronic component (1; 1a) according to a preferred embodiment of the present invention includes a support member (2), a piezoelectric film (4), and an interdigital transducer (5). The support member (2) includes silicon as a primary component. The piezoelectric film (4) is provided directly or indirectly on the support member (2). The interdigital transducer (5) includes a plurality of electrode fingers (51). The plurality of electrode fingers (51) are provided side by side separately from each other. The interdigital transducer (5) is provided on the principal surface (41) of the piezoelectric film (4). The film thickness (L1) of the piezoelectric film (4) in the thickness direction of the support member (2) (first direction D1) is about 3.5 λ or less, where λ denotes the wavelength of an acoustic wave determined by the electrode finger pitch of the interdigital transducer (5). The support member (2) includes a high-impurity-concentration region (27) and a low-impurity-concentration region (28). The high-impurity-concentration region (27) includes an impurity. The low-impurity-concentration region (28) is a region having a lower impurity concentration than the high-impurity-concentration region (27). The low-impurity-concentration region (28), the piezoelectric film (4), and the interdigital transducer (5) together define an acoustic wave element (29). The acoustic velocity of a bulk wave that propagates through the low-impurity-concentration region (28) is higher than the acoustic velocity of an acoustic wave that propagates through the piezoelectric film (4). The high-impurity-concentration region (27) defines the semiconductor element (26) and is farther from the piezoelectric film (4) than the low-impurity-concentration region (28).

According to the above-described electronic component (1; 1a), the semiconductor element (26) is provided in the high-impurity-concentration region (27) of the support member (2), and the acoustic wave element (29) is provided in the low-impurity-concentration region (28) of the support member (2). In the support member (2), since the acoustic-wave-element-(29)-side impurity concentration is low, a leakage current to the support member (2) does not readily occur. As a result, even when the semiconductor element (26) is provided in the support member (2), the occurrence of leakage current to the support member (2) is able to be significantly reduced or prevented while size reduction is achieved. Further, a composite device of the acoustic wave element (29) and the semiconductor element (26) is able to be provided while significantly reducing or preventing loss of the acoustic wave element (29).

According to an electronic component (1; 1a) according to a preferred embodiment of the present invention, the distance between the principal surface (41) of the piezoelectric film (4) and the high-impurity-concentration region (27) is about 40 λ or more.

According to the above-described electronic component (1; 1a), in the support member (2), the low-impurity-concentration region (28) exists in the region in which the energy of the acoustic wave hardly exists, and, as a result, a leakage current is able to be further reduced.

According to an electronic component (1; 1a) according to a preferred embodiment of the present invention, the thickness (L3) of the low-impurity-concentration region (28) in the thickness direction (first direction D1) in the first or the second aspect is about 10 λ or more and about 180 μm or less.

According to the above-described electronic component (1; 1a), the maximum phase value in a higher-order mode is able to be decreased, and the strength in the higher-order mode is able to be reduced. In addition, deterioration of the heat dissipation effect due to the low-impurity-concentration region (28) increasing in thickness is able to be significantly reduced or prevented from occurring, and a reduction in profile is able to be provided.

According to an electronic component (1) according to a preferred embodiment of the present invention, a low acoustic velocity film (3) is further included. The low acoustic velocity film (3) is provided between the support member (2) and the piezoelectric film (4), and the acoustic velocity of a bulk wave that propagates through the low acoustic velocity film (3) is lower than the acoustic velocity of a bulk wave that propagates through the piezoelectric film (4).

According to the above-described electronic component (1), in the low acoustic velocity film (3), the acoustic velocity of an acoustic wave is reduced, and an effect of confining the acoustic wave energy to the piezoelectric film (4) and the interdigital transducer (5) in which the acoustic wave is excited is able to be improved. As a result, loss is able to be reduced or prevented and the Q factor is able to be increased compared with the case in which the low acoustic velocity film (3) is not provided.

According to an electronic component (1; 1a) according to a preferred embodiment of the present invention, the low acoustic velocity film (3) is made of silicon oxide.

According to the above-described electronic component (1; 1a), the temperature characteristics are able to be significantly improved. The elastic constant of the piezoelectric film (4) has negative temperature characteristics, and the silicon oxide has positive temperature characteristics. Therefore, the absolute value of the TCF of the electronic component (1; 1a) is able to be reduced. Further, the specific acoustic impedance in silicon oxide is less than the specific acoustic impedance in the piezoelectric film (4). Therefore, both an increase in electromechanical coupling coefficient, that is, enlargement of the band width ratio, and a significant improvement in the temperature coefficient of frequency are able to be provided.

According to an electronic component (1; 1a) according to a preferred embodiment of the present invention, the film thickness of the low acoustic velocity film (3) is about 2 $\lambda$ or less.

According to the above-described electronic component (1; 1a), the film stress is able to be reduced. As a result, warping of the wafer is able to be reduced or prevented, and a significant improvement in the non-defective rate and stabilization of characteristics are able to be provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
    a support member including silicon as a primary component;
    a piezoelectric film directly or indirectly provided on the support member; and
    an interdigital transducer including a plurality of electrode fingers provided side by side separately from each other and provided on a principal surface of the piezoelectric film; wherein
    a film thickness of the piezoelectric film in a thickness direction of the support member is about 3.5 $\lambda$ or less, where $\lambda$ denotes a wavelength of an acoustic wave determined by an electrode finger pitch of the interdigital transducer;
    the support member includes:
        a high-impurity-concentration region including an impurity; and
        a low-impurity-concentration region having a lower impurity concentration than the high-impurity-concentration region;
    the low-impurity-concentration region, the piezoelectric film, and the interdigital transducer together define an acoustic wave element, and an acoustic velocity of a bulk wave that propagates through the low-impurity-concentration region is higher than an acoustic velocity of an acoustic wave that propagates through the piezoelectric film; and
    the high-impurity-concentration region defines the semiconductor element and is farther from the piezoelectric film than the low-impurity-concentration region.

2. The electronic component according to claim 1, wherein a distance between the principal surface of the piezoelectric film and the high-impurity-concentration region is about 40 $\lambda$ or more.

3. The electronic component according to claim 1, wherein a thickness of the low-impurity-concentration region in the thickness direction is about 10 $\lambda$ or more and about 180 µm or less.

4. The electronic component according to claim 1, further comprising:
    a low acoustic velocity film provided between the support member and the piezoelectric film; wherein
    an acoustic velocity of a bulk wave that propagates through the low acoustic velocity film is lower than the acoustic velocity of a bulk wave that propagates through the piezoelectric film.

5. The electronic component according to claim 4, wherein the low acoustic velocity film includes silicon oxide.

6. The electronic component according to claim 4, wherein a film thickness of the low acoustic velocity film is about 2 $\lambda$ or less.

7. The electronic component according to claim 1, wherein the support member includes a substrate and a low-impurity film.

8. The electronic component according to claim 7, wherein
    the substrate is a silicon substrate; and
    the low-impurity film is an undoped semiconductor film.

9. The electronic component according to claim 7, wherein an acoustic velocity of a bulk wave that propagates through the low-impurity film is higher than the acoustic velocity of a bulk wave that propagates through the piezoelectric film.

10. The electronic component according to claim 1, wherein the plurality of electrode fingers of the interdigital transducer includes a first plurality of electrode fingers connected to a first busbar and a second plurality of electrode fingers connected to a second busbar.

11. The electronic component according to claim 4, wherein a film thickness of the low acoustic velocity film is greater than about 0.5 $\lambda$.

12. The electronic component according to claim 4, further comprising an insulating film provided directly or indirectly on the support member, with the support member provided between the insulating film and the low acoustic velocity film.

13. The electronic component according to claim 11, wherein an electrode is provided on a surface of the insulating film.

14. The electronic component according to claim 7, wherein at least one electrode is provided on a surface of the substrate.

* * * * *